(12) United States Patent
Yamashita

(10) Patent No.: US 6,570,166 B2
(45) Date of Patent: May 27, 2003

(54) OPERATION METHOD OF ION SOURCE AND ION BEAM IRRADIATION APPARATUS

(75) Inventor: Takatoshi Yamashita, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 194 days.

(21) Appl. No.: 09/847,404

(22) Filed: May 3, 2001

(65) Prior Publication Data

US 2002/0029746 A1 Mar. 14, 2002

(30) Foreign Application Priority Data

May 10, 2000 (JP) ........................... 2000-136692

(51) Int. Cl.[7] ............................................. H01J 37/317
(52) U.S. Cl. ...................... 250/425; 250/424; 250/423 R
(58) Field of Search ................... 250/425, 424, 250/423 R

(56) References Cited

U.S. PATENT DOCUMENTS 4,719,355 A 1/1988 Meyers et al.
5,977,552 A * 11/1999 Foad ........................ 250/472.21

FOREIGN PATENT DOCUMENTS

| EP | 0954008 A2 | 11/1999 |
|---|---|---|
| GB | 2307594 A | 5/1997 |
| JP | 03013576 | 3/1991 |

* cited by examiner

Primary Examiner—Kiet T. Nguyen
(74) Attorney, Agent, or Firm—Finnegan, Henderson, Farabow, Garrett & Dunner LLP

(57) ABSTRACT

This ion source 2 has the heating furnace 4 for heating a solid material 6 to produce a vapor 8, the plasma production vessel 16 for producing a plasma 24 by ionizing this vapor 8, and the vapor conduit tube 10 connecting both the heating furnace 4 and the plasma production vessel 16. In this ion source 2, using indium fluoride 6a as the solid material 6, an ion beam 30 containing indium ions is led out, while the temperature of the heating furnace 4 is kept in a range from 450° to 1170° C., and below the temperature of the plasma production vessel 16.

3 Claims, 2 Drawing Sheets

OPERATION METHOD OF ION SOURCE AND ION BEAM IRRADIATION APPARATUS

BACKGROUND OF THE INVENTION

1. Field of the Invention

The present invention relates to a method for operating an ion source for use with an ion beam irradiation apparatus such as an ion implantation system, and the ion beam irradiation apparatus for practicing the operation method, and more particularly to means for leading out an ion beam containing indium ions from an ion source stably.

2. Description of the Related Art

In the fields of semiconductor manufacture, indium ion has drawn a great deal of attention.

In the publication of Japanese Patent Unexamined Publication No. Hei.3-13576 (JP-A-3-13576), a method for leading out an ion beam containing indium ions from the ion source has been disclosed in which after a heating furnace (carbon container) containing indium iodide is preheated up to temperatures from 100° C. to 200° C., the heating furnace is further heated to temperatures from 300° C. to 500° C. to produce a vapor from indium iodide, and this vapor is introduced through a vapor conduit tube into a plasma production vessel (discharge chamber) to ionize the vapor by arc discharge.

With the above method, because the melting point of indium iodide is 210° C., indium iodide is completely molten within the heating furnace to become a liquid state, if the heating furnace is operated in the temperature range from 300° C. to 500° C. Consequently, liquefied indium iodide is deposited in mucus on the heating furnace, the plasma production vessel and the vapor conduit tube connecting both of them to contaminate their inside, or clog the vapor conduit tube, so that the ion beam can not be led out stably.

Owing to the contamination, the replacement or cleaning of the heating furnace, the plasma production vessel and the vapor conduit tube is required frequently, for example, every time the operation of ion source is stopped, which is impractical.

SUMMARY OF THE INVENTION

Thus, it is an object of this invention to provide means for leading out an ion beam containing indium ions from an ion source stably, while preventing the contamination of the heating furnace, the vapor conduit tube and the plasma production vessel.

According to this invention, there is provided a method for operating an ion source comprising a heating furnace for heating a solid material to produce a vapor, and a plasma production vessel for producing a plasma by ionizing the vapor supplied through a vapor conduit tube from the heating furnace, wherein the solid material is indium fluoride, and an ion beam containing indium ions is led out by producing a plasma within the plasma production vessel, while the temperature of the heating furnace is kept in a range from 450° C. to 1170° C., and below a temperature of the plasma production vessel.

Namely, supposing that when an ion beam is led out, the temperature of the heating furnace is $T_1$[° C.], and the temperature of the plasma production vessel is $T_2$[° C.], the following relation holds to lead out the ion beam.
[Numerical Expression 1]

$$450 \leq T_1 < 1170 \text{ and } T_1 < T_2 \text{ (unit: ° C.)}$$

According to the experiments, an ion beam containing indium ions could be led out by elevating the temperature $T_1$ of the heating furnace to 450° C. or higher to produce a vapor of indium fluoride. When the temperature $T_1$ is below 450° C., the vapor of indium fluoride hardly occurs, whereby few indium ions can not be led out, which is impractical.

And since the melting point of indium fluoride is 1170° C., and the temperature $T_1$ of the heating furnace is kept below this melting point in case of leading out the ion beam, the vapor is produced but indium fluoride is not molten. Accordingly, it is possible to prevent liquefied indium fluoride from sticking to the heating furnace, the plasma production vessel, and the vapor conduit tube connecting them, thereby causing the contamination of them or clogging of the vapor conduit tube.

Further, since the temperature $T_1$ of the heating furnace is kept below the temperature $T_2$ of the plasma production vessel when leading out the ion beam, in other words, the temperature $T_2$ of the plasma production vessel is higher than the temperature $T_1$ of the heating furnace, the vapor conduit tube connecting the heating furnace and the plasma production vessel gives rise to a temperature gradient in which the temperature rises towards the plasma production vessel. Owing to this temperature gradient, the vapor produced within the heating furnace can be prevented from recoagulating in the vapor conduit tube or plasma production vessel, thereby it can be prevented from contaminating the plasma production vessel or vapor conduit tube or clogging the vapor conduit tube. This effect can be obtained without too great difference between the temperatures $T_1$ and $T_2$. For example, this temperature difference may be as small as about 10° C. to 20° C.

As a result, an ion beam containing indium ions can be led out stably from the ion source, while preventing the contamination of the heating furnace, the vapor conduit tube and the plasma production vessel.

In the publication JP-A-3-13576, there was a description that indium fluoride had the problem, and was unsuitable to produce indium ions. However, according to this invention, an ion beam containing indium ions can be led out stably, while preventing the contamination of the plasma production vessel, as previously described. Accordingly, the indium ion beam can be utilized stably.

Note that a control unit for keeping the temperature $T_1$ of the heating furnace when leading out the ion beam from the ion source in accordance with the Numerical Expression 1 may be provided. With such control unit, the ion source can be operated with labor-saving and automatically.

The ion beam is preferably led out by keeping the temperature $T_1$ of the heating furnace in the range from 450° C. to 1170° C. after the heating furnace and the plasma production vessel are preheated in a vacuum atmosphere at temperatures from 250° C. to 450° C. The vacuum atmosphere is used to prevent the reaction with oxygen or water content in the residual gases. This preheating may be performed for the heating furnace and the plasma production vessel at the same time, or separately. Indium fluoride may be put within the heating furnace at the time of preheating, or after preheating.

By preheating at temperatures of 250° C. or greater, the water content can be removed almost completely in short time from inside the heating furnace and the plasma production vessel, and further indium fluoride, if any. At the temperatures below 250° C., it takes too much time to effect the preheating and it is difficult to remove the water content completely. As a result of this preheating, it is possible to avoid production of hydrofluoric acid or hydrogen fluoride due to reaction between indium fluoride and the water content. Therefore, the contamination of the plasma production vessel or the vacuum vessel containing the ion source can be prevented more securely. Though hydrofluoric acid or hydrogen fluoride is a strong acid substance that is unfavorable for a vacuum pump or the human body, the production of hydrofluoric acid or hydrogen fluoride can be prevented.

And by preheating at temperatures below 450° C., evaporation of indium fluoride at the time of preheating can be prevented. If indium fluoride is evaporated at the time of preheating, there is the possibility that the plasma production vessel or the vacuum vessel may be contaminated. However, in the present invention, contamination of the plasma production vessel or the vacuum vessel can be prevented.

Halides of indium include sulfur bromide, indium chloride, and indium iodide, besides indium fluoride, but because they have lower melting points than indium fluoride, the temperature of the heating furnace immediately rises above those melting points to obtain the vapor amount required to lead out an ion beam. Also, owing to preheating at temperatures as previously described, a considerable molecular weight has already evaporated. As a result, the plasma production vessel or the vacuum vessel is contaminated by bromine, chlorine or iodine. The vapor conduit tube may be clogged. On the contrary, among indium halides, indium fluoride has the highest melting point, and does not cause the problem as above described. Accordingly, indium fluoride is most preferable. In this way, the inventors have found that indium fluoride is optimal to lead out indium ions.

Indium fluoride is hydrous or anhydrous, and it is preferable to use hydrous indium fluoride. This is more beneficial to prevent the contamination of the heating furnace or plasma production vessel, or the production of strong acid substance.

Also, indium fluoride maybe preheated within the heating furnace at the same time of preheating the heating furnace. In this way, the water content can be removed more completely to be more beneficial to prevent the contamination. And if the preheating is performed at the same time, the operation is simplified. Alternately, indium fluoride which has been heated at temperatures from 250° C. to 450° C. in other place to remove the water content beforehand may be brought into the heating furnace while keeping it away from the water content. In this way, the starting time of the ion source can be shortened.

DETAILED DESCRIPTION OF THE PREFERRED EMBODIMENT

Figure 1:
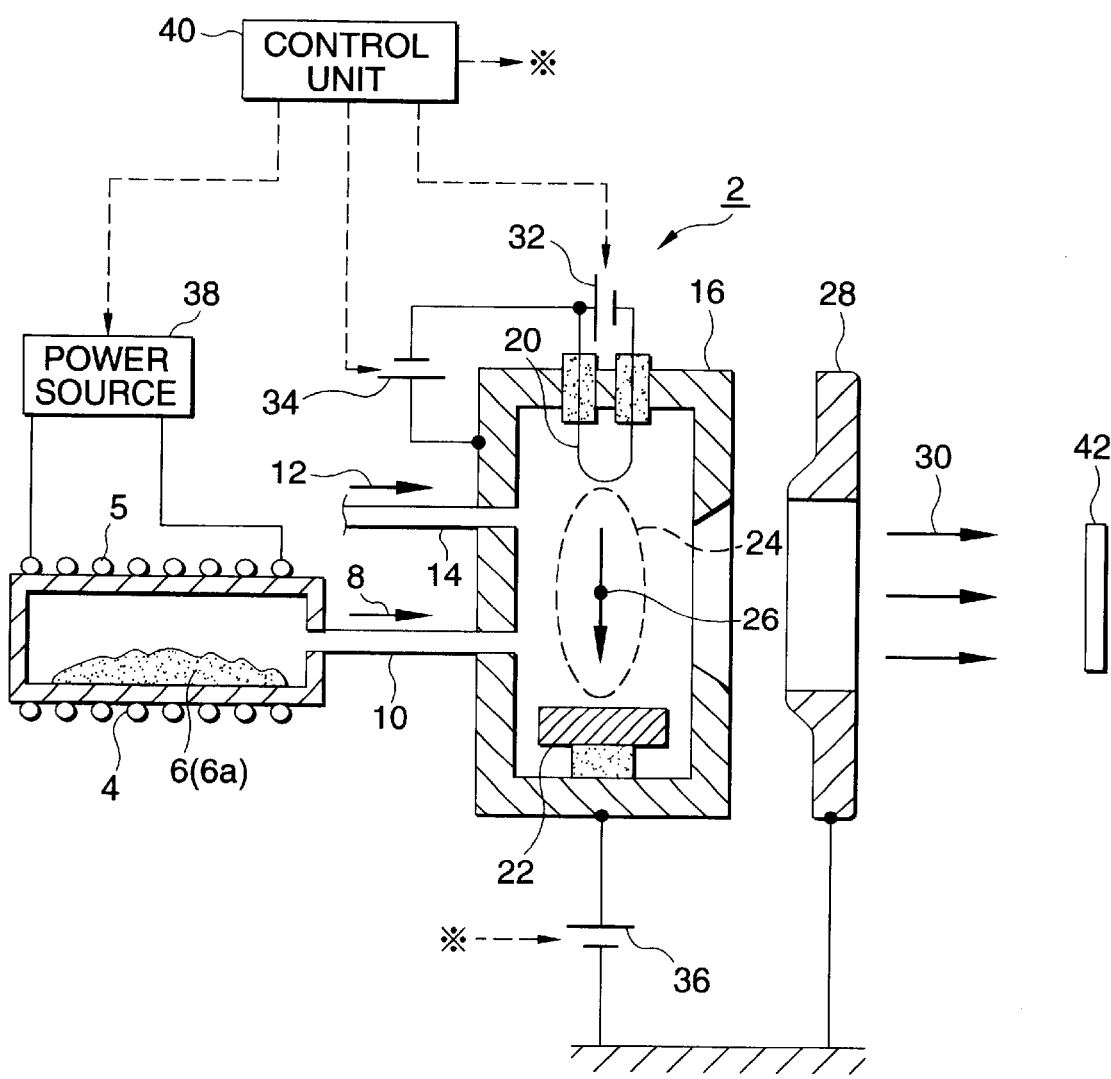
FIG. 1 is a schematic view illustrating an example of an ion beam irradiation apparatus around an ion source according to this invention.

FIG. 1 is a schematic view illustrating an example of an ion beam irradiation apparatus around an ion source according to this invention.

This ion beam irradiation apparatus performs the mass separation of an ion beam 30 led out from an ion source 2, as required, and radiates the ion beam to a subject 42 to effect ion implantation into the subject 42. Note that the subject 42 is placed near the ion source 2 for the convenience of drawing, but in practice disposed much downstream of the ion source 2.

In this example, the ion source 2 comprises: a heating furnace 4 for heating a solid material 6 and produces its vapor 8; a vapor conduit tube 10 for connecting the heating furnace 4 and a plasma production vessel 16 and introducing the vapor 8 from the heating furnace 4 into the plasma production vessel 16; the plasma production vessel 16 for producing a plasma 24 by ionizing the vapor 8 introduced through this vapor conduit tube 10; and a lead-out electrode 28 for leading out an ion beam 30 from the plasma 24 within this plasma production vessel 16 owing to the influence of the electric fields. Further, in this example, a gas inlet tube 14 is provided to introduce an auxiliary gas 12 into the plasma production vessel 16.

In this example, the heating furnace 4 has a heater 5 for heating. And the heater 5 is energized by a heating power source 38 and generates a heat.

A filament 20 for thermionic emission is provided on one side within the plasma production vessel 16, and a reflector 22 for reflection of electrons is provided on the other side. A magnetic field 26 for capturing electrons is applied from the outside into the plasma production vessel 16. The ion source 2 of this structure is referred to as a Bernus type ion source.

The filament 20 is heated by a filament power source 32. An arc voltage for arc discharge is applied from an arc power source 34 between the filament 20 and the plasma production vessel 16 serving as anode. Between the plasma production vessel 16 and the lead-out electrode 28, a lead-out voltage for leading out the ion beam is applied from a lead-out power source 36. These power sources 32, 34, 36 and the heating power source 38 are controlled by a control unit 40 in this example.

One example of an operation procedure (operation process) for this ion source 2 will be described below.

A. Starting the ion source 2

(1) After anhydrous indium fluoride 6a as the solid material 6 is put into the heating furnace 4, a vacuum vessel (not shown) accommodating this ion source 2 is evacuated to make its pressure below a predetermined pressure $P_1$ (e.g., $1 \times 10^{-3}$ Pa)

(2) The filament 20 is energized and heated by the filament power source 32, so that the temperature of the plasma production vessel 16 is kept at about 300° C., while the plasma production vessel 16 is preheated (baked) for some time.

(3) The gases including the water content are discharged by preheating to increase the pressure of the vacuum vessel, but because the vacuum vessel is continuously evacuated, the pressure of the vacuum vessel will drop. If the pressure is restored below a predetermined pressure $P_3$ (e.g., $1 \times 10^{-3}$ Pa), the temperature of the heating furnace 4 is gradually increased, whereby the heating furnace 4 with indium fluoride 6a inside is preheated (prebaked) at about 300° C.

(4) If the pressure within the vacuum vessel drops below a predetermined pressure $P_4$ (e.g., $1 \times 10^{-3}$ Pa), and has a decreasing tendency, the preheating is terminated. The decreasing tendency means that the evacuation is superior to the discharge of gases.

(5) Ar gas as an auxiliary gas 12 is introduced into the plasma production vessel 16, and an arc voltage is applied from the arc power source 34 to produce a plasma 24 within the plasma production vessel 16. Thereby, the temperature $T_2$ within the plasma production vessel 16 is normally kept at temperatures from 500° C. to 1000° C.

(6) The temperature T1 of the heating furnace 4 is set within a range meeting the conditions of Numerical Expression 1, such that a required amount of vapor can be obtained. For example, the temperature is made from 450° C. to 700° C. Thereby, a vapor 8a of indium fluoride 6a is produced and introduced into the plasma production vessel 16. Since an arc discharge has been generated within the plasma production vessel 16 in the previous process (5), the vapor 8 introduced therein is ionized, so that the plasma 24 containing indium ions is produced.

(7) In this state, a lead-out voltage is applied from the lead-out power source 36 to lead out an ion beam 30 containing indium ions, and radiate the ion beam 30 to the subject 42 to effect ion implantation.

With this method, the ion beam 30 containing indium ions can be led out stably from the ion source 2, while preventing the contamination of the heating furnace 4, the vapor conduit tube 10, the plasma production vessel 16, and the vacuum vessel accommodating the ion source 2, and the clogging of the vapor conduit tube 10, owing to the reasons previously described.

If the vaporized indium fluoride is converted into plasma within the plasma production vessel 16, radical fluorine is produced. This has the effect of cleaning an inner wall of the plasma production vessel 16, because the radical fluorine is very reactive. Thereby, the cleaning of the plasma production vessel 16 can be simplified, or the life of the plasma production vessel 16 extended.

B. Ending the Ion Source 2

(8) The heating furnace 4 is stopped by turning off the heating power source 38, so that the temperature of the heating furnace 4 is decreased below 300° C. Thereby, the vapor 8 is not produced.

(9) To lead out the ion beam 30 is ended by cutting off the lead-out voltage from the lead-out power source 36.

(10) The plasma 24 is quenched by shutting off the introduction of the auxiliary gas 12.

(11) The conduction of electricity to the filament 20 is cut off. Thereby, the temperature of the plasma production vessel 16 decreases. Note that the arc voltage may be cut off at this time or after the process (10).

With this method, after the vapor 8 has not been produced in the process (8), to lead out the ion beam 30 is ended. Hence, indium fluoride can be prevented from remaining or adhering within the plasma production vessel 16. Also, the switching to other ion species is facilitated.

Note that the pressures $P_1$, $P_3$ and $P_4$ in the above processes (1), (3) and (4) may be set to such a degree of vacuum that the residual oxygen or water content may have negligible effect on indium fluoride. For example, those pressures may be from $1 \times 10^{-3}$ Pa to $1 \times 10^{-4}$ Pa.

The auxiliary gas 12 introduced in the process (5) may be an inert gas other than Ar gas, or a fluorine compound gas. For example, Xe, $BF_3$, $GeF_4$, and $N_2$ gases, which contain no oxygen or hydrogen in the bonded atoms, are preferable. Using such gases containing no hydrogen or oxygen, the strong acid substance such as hydrofluoric acid or hydrogen fluoride can be prevented from being produced within the plasma production vessel 16.

Incidentally, the auxiliary gas 12 helps to produce the plasma 24 when the vapor pressure within the plasma production vessel 16 due to the vapor 8 is low. In the case where the vapor pressure (e.g., $1 \times 10^{-3}$ Pa or greater) sufficient to produce the plasma 24 within the plasma production vessel 16 stably due to the vapor 8 at the temperature of the heating furnace in the process (6) can be obtained, there is no necessity of providing the process (5), and the plasma 24 may be produced directly by the vapor 8 introduced in the process (6).

Since the amount of vapor for indium fluoride is very sensitive to the temperature, it is preferred that the heating temperature $T_1$ of the heating furnace 4 in the process (6) is controlled at a precision of about $\pm 1°$ C. to keep the lead-out amount of indium ions constant.

A control unit for controlling the temperature $T_1$ of the heating furnace 4 in accordance with the relation of Numerical Expression 1 when leading out the ion beam from the ion source 2 (i.e., in the processes (6) and (7)) may be provided, whereby the ion source 2 can be operated with labor-saving and automatically. In this example, the control unit 40 is provided. This control unit 40 controls the starting operation of the ion source 2 as indicated at A and the ending operation as indicated at B in this example.

This invention can be applied to the ion sources other than the Bernus type ion source, irrespective of means for producing the plasma 24 within the plasma production vessel 16. For example, a Freeman type ion source employing a bar-like filament, a Bucket type ion source employing a multipolar magnetic field (cusp magnetic field) for confinement of plasma, a high-frequency ion source employing the high frequency (including the micro wave) for production of plasma, an ECR type ion source employing an ECR (electron cyclotron resonance) for production of plasma may be applicable.

EXAMPLE

Using anhydrous indium fluoride 6a as the solid material 6, an experiment was conducted in which the ion source 2 as shown in FIG. 1 was operated in accordance with the operation procedure to lead out the ion beam 30 containing indium ions and apply the ion beam 30 to the subject 42.

The preheating in the process (3) was performed to increase the temperature up to 300° C. in about 20 minutes and maintain its state for 10 minutes. The Ar gas as the auxiliary gas 12 in the process (5) was supplied at 1 ccm under the control of a flow controller. The temperature $T_1$ of the heating furnace 4 in the processes (6) and (7) was made 600° C. In this state, the operation of leading out the ion beam 30 was conducted for about 150 minutes. The lead-out voltage from the lead-out power source 36 was 25 kV.

Figure 2:
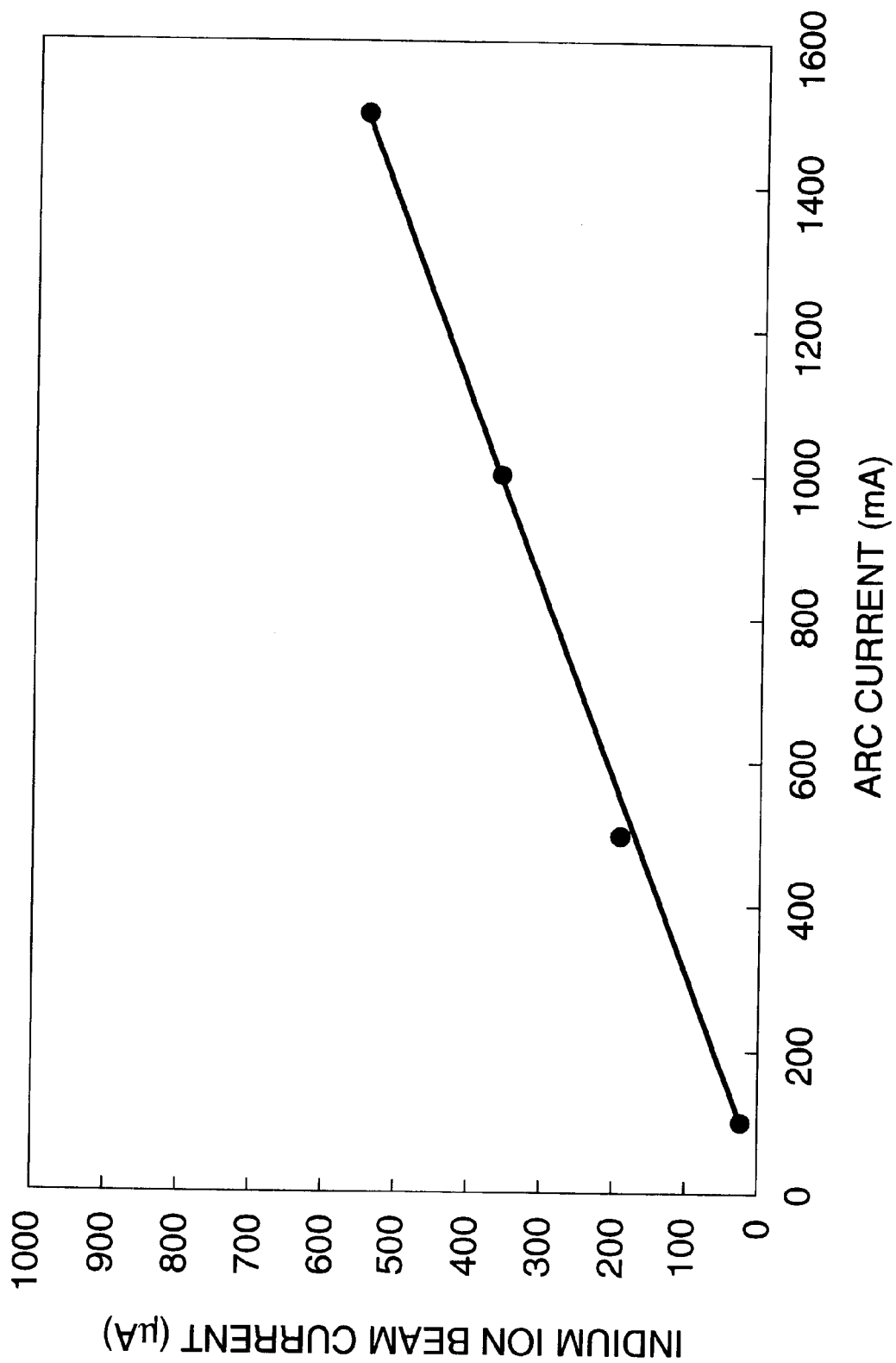
FIG. 2 is a graph showing an example of the measured result of the indium ion beam current obtained when the arc current is varied in the ion source of FIG. 1.

FIG. 2 shows how the indium ion beam current changes when the arc current is varied in this operation. This indium ion beam current flows through the subject 42 owing to the indium ion beam obtained by mass separating the ion beam 30 led out from the ion source 2. As shown in FIG. 2, it can be seen that the indium ion beam current is increased proportional to the arc current, and has the excellent controllability.

Observing the contamination of the ion source 2 after operation, the contamination of the plasma production vessel 16 and the vacuum vessel accommodating this ion source 2 was favorable, in which there was little difference from the operation of the ion source 2 only with Ar gas. Further, the contamination or clogging of the heating furnace 4 and the vapor conduit tube 10 was not observed.

This invention has been configured in the above manner, and has the following effects.

According to claim 1 of the invention, a vapor of indium fluoride can be produced, while indium fluoride is prevented from being molten in the heating furnace. And the temperature gradient occurs in the vapor conduit tube to prevent the vapor from being resolidified within the vapor conduit tube or the plasma production vessel. Therefore, an ion beam containing indium ions can be stably led out from the ion source, while the contamination of the heating furnace, the vapor conduit tube and the plasma production vessel is suppressed. Thereby, the practical utilization of indium ions can be effected.

According to claim 2 of the invention, there is a further effect that the contamination of the plasma production vessel or the vacuum vessel accommodating the ion source can be securely prevented.

According to claim 3 of the invention, there is the same effect as claim 1 of the invention, and further the ion source can be operated with labor-saving and automatically.

What is claimed is:

1. A method for operating an ion source in which a heating furnace for producing a vapor by heating a solid material and a plasma production vessel for producing a plasma by ionizing the vapor supplied through a vapor conduit tube from said heating furnace are provided, the method comprising the step of:

leading out an ion beam containing indium ions from said solid material being indium fluoride in such a manner that a temperature of said heating furnace is kept in a range from 450° C. to 1170° C., and below a temperature of said plasma production vessel.

2. The method according to claim 1, comprising the step of leading out the ion beam in such a manner that the temperature of said heating furnace is kept in said range from 450° C. to 1170° C. after said heating furnace and said plasma production vessel are preheated in a vacuum atmosphere at temperatures from 250° C. to 450° C.

3. An ion beam irradiation apparatus for applying an ion beam to a subject, comprising:

an ion source for producing an ion beam containing indium ions, which includes a heating furnace for producing a vapor by heating indium fluoride, and a plasma production vessel for producing a plasma by ionizing the vapor supplied through a vapor conduit tube from said heating furnace; and a control unit for keeping a temperature of said heating furnace in a range from 450° C. to 1170° C., and below a temperature of said plasma production vessel, when said ion source produces the ion beam.

* * * * *